United States Patent
Gruening et al.

(10) Patent No.: US 6,437,381 B1
(45) Date of Patent: Aug. 20, 2002

(54) SEMICONDUCTOR MEMORY DEVICE WITH REDUCED ORIENTATION-DEPENDENT OXIDATION IN TRENCH STRUCTURES

(75) Inventors: Ulrike Gruening, Munich (DE); Rajarao Jammy, Wappinger Falls; Helmut H. Tews, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/560,081

(22) Filed: Apr. 27, 2000

(51) Int. Cl.[7] .................. A01L 29/76; A01L 29/94; A01L 31/113; A01L 31/119; A01L 31/062
(52) U.S. Cl. ............ 257/296; 257/297; 257/298; 257/301; 257/302; 257/303; 257/305
(58) Field of Search ................ 257/296, 297, 257/298, 301–305, 306

(56) References Cited

U.S. PATENT DOCUMENTS

| | | | |
|---|---|---|---|
| 4,168,999 A | | 9/1979 | Vora et al. |
| 4,432,132 A | | 2/1984 | Kinsbron et al. |
| 4,672,410 A | * | 6/1987 | Miura et al. ............. 257/23.6 |
| 4,763,180 A | | 8/1988 | Hwang et al. |
| 4,766,477 A | | 8/1988 | Nakagawa et al. |
| 4,881,105 A | | 11/1989 | Davari et al. |
| 4,965,219 A | | 10/1990 | Cerofolini |
| 4,969,020 A | | 11/1990 | Matsushita et al. |
| 4,985,744 A | | 1/1991 | Spratt et al. |
| 5,021,355 A | | 6/1991 | Dhong et al. |
| 5,128,272 A | | 7/1992 | Ramde |
| 5,177,576 A | | 1/1993 | Kimura et al. |
| 5,252,845 A | | 10/1993 | Kim et al. |
| 5,254,485 A | | 10/1993 | Segawa et al. |
| 5,323,054 A | | 6/1994 | Kanda et al. |
| 5,406,515 A | * | 4/1995 | Rajeevakumar ............. 365/182 |
| 5,414,288 A | | 5/1995 | Fitch et al. |
| 5,514,614 A | | 5/1996 | Yuki et al. |
| 5,679,979 A | | 10/1997 | Weingand |
| 5,869,868 A | * | 2/1999 | Rajeevakumar ............. 257/350 |
| 5,937,296 A | * | 8/1999 | Arnold ..................... 438/270 |
| 6,018,174 A | * | 1/2000 | Schrems et al. ............ 257/296 |
| 6,281,539 B1 | * | 8/2001 | Mandeman et al. ........ 257/302 |
| 6,348,388 B1 | * | 2/2002 | Faltermeier et al. ........ 438/303 |

OTHER PUBLICATIONS

U. Gruening et al; "A Novel Trench Dram Cell with a VERtIcal Access Transistor and BuriEd Strap (VERI BEST) for 4Gb/16Gb"; Mar. 1999; 4 pages.

* cited by examiner

*Primary Examiner*—Eddie Lee
*Assistant Examiner*—Jesse A. Fenty
(74) *Attorney, Agent, or Firm*—Steven Capella

(57) ABSTRACT

A process for forming an oxide layer on a sidewall of a trench in a substrate. The process comprises the steps of forming the trench in the substrate, forming a nitride interface layer over a portion of the trench sidewall, forming an amorphous layer over the nitride interface layer, and oxidizing the amorphous layer to form the oxide layer. The process may be used, for example, to form a gate oxide for a vertical transistor, or an isolation collar. The invention also comprises a semiconductor memory device comprising a substrate, a trench in the substrate having a sidewall, an isolation collar comprising an isolation collar oxide layer on the trench sidewall in an upper region of the trench, and a vertical gate oxide comprising a gate oxide layer located on the trench sidewall above the isolation collar. The isolation collar oxide layer is disposed over an isolation collar nitride interface layer between the isolation collar oxide layer and the trench sidewall, the gate oxide layer is disposed over a gate nitride interface layer between the gate oxide layer and the trench sidewall, or both.

13 Claims, 4 Drawing Sheets

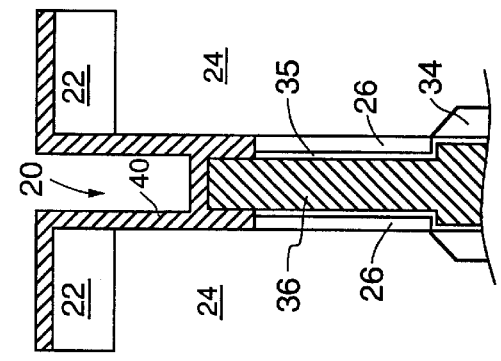
Fig. 5 (PRIOR ART)
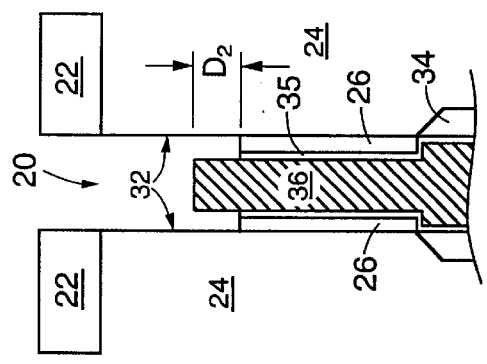
Fig. 6 (PRIOR ART)
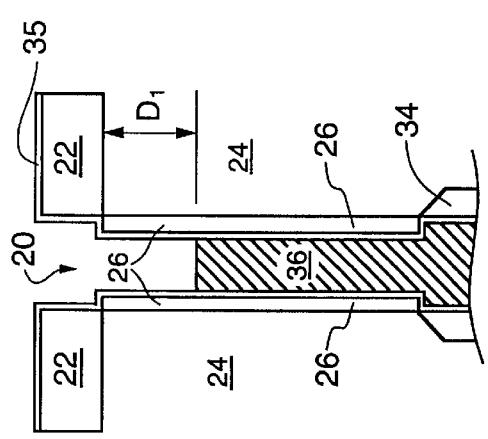
Fig. 7 (PRIOR ART)
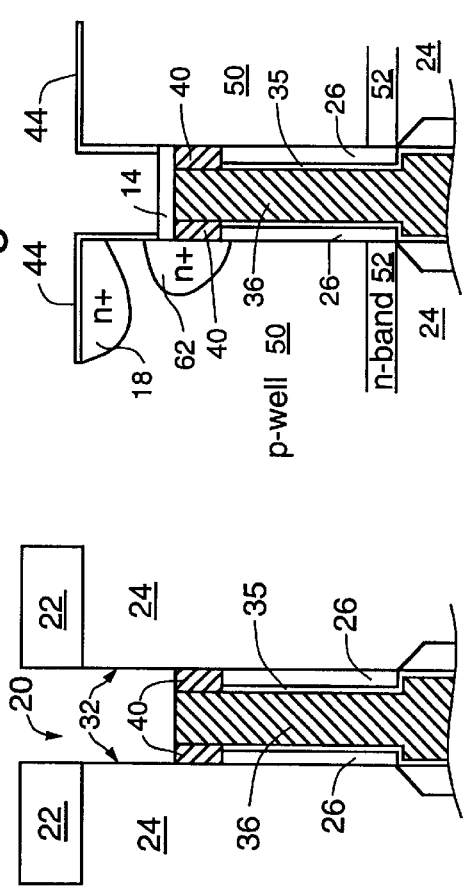
Fig. 8 (PRIOR ART)
Fig. 9 (PRIOR ART)
Fig. 10 (PRIOR ART)

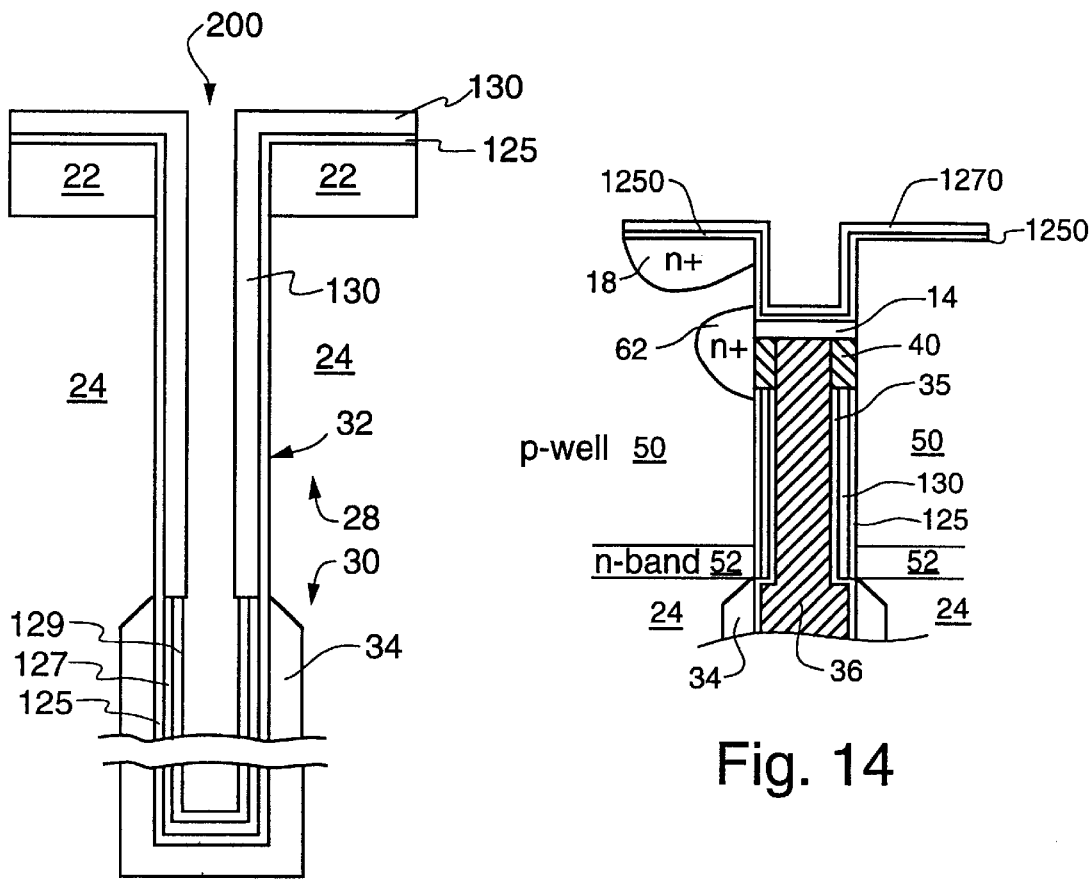
Fig. 13
Fig. 14
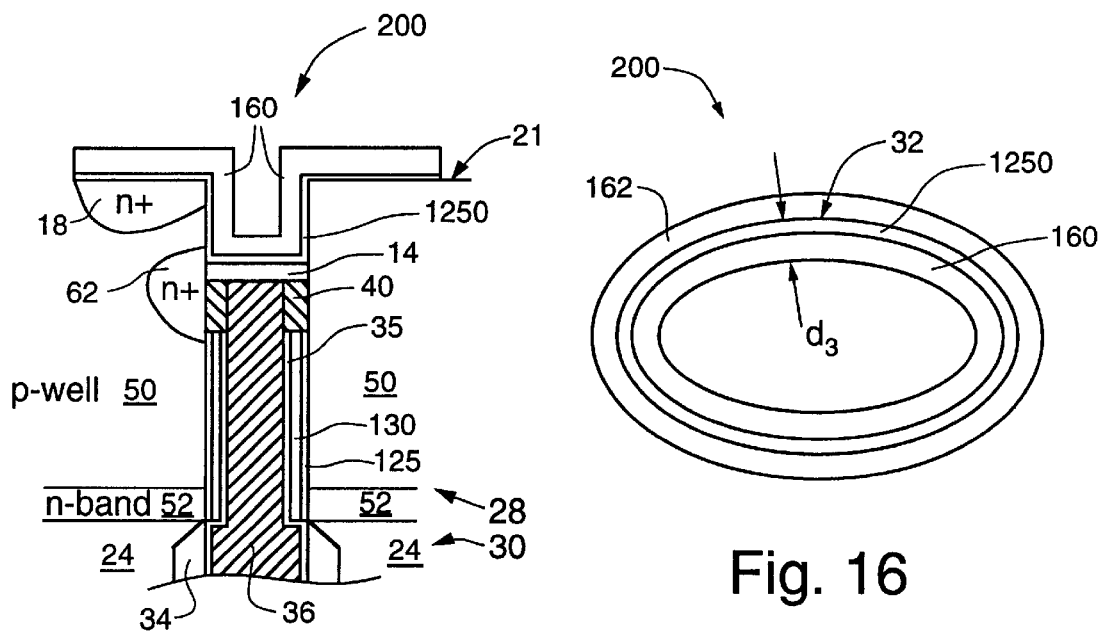
Fig. 15
Fig. 16

US 6,437,381 B1

SEMICONDUCTOR MEMORY DEVICE WITH REDUCED ORIENTATION-DEPENDENT OXIDATION IN TRENCH STRUCTURES

TECHNICAL FIELD

The present invention relates generally to vertical transistor structures in the trench capacitors of Dynamic Random Access Memory (DRAM) cells and, more specifically, to a process for manufacture of such structures.

BACKGROUND OF THE INVENTION

Semiconductor memory devices comprising vertical transistor structures in trench capacitors are well known in the art to save surface area on electronic circuits such as DRAM chips. FIG. 1 schematically illustrates a typical semiconductor memory device. A more detailed depiction of such a semiconductor memory device is provided in FIG. 12. Semiconductor memory device 10 comprises a capacitor trench 12, an isolation or "trench top" oxide (TTO) 14, a gate oxide 16, diffusion regions (contact implants) 18, a gate contact 220, a source contact 222, and gate sidewall isolation spacers 240. Of the elements of semiconductor memory device 10, only gate contact 220, source contact 222, and gate sidewall isolation spacers 240 are above the surface 21 of the substrate 24, which is typically a silicon wafer.

FIG. 2 is a cross section taken along line 2—2 in FIG. 1. As shown in FIG. 2, gate oxide 16 forms a continuous faceted wall formed of planes aligned with the (100) and (110) crystal planes for a silicon wafer with a (100) surface orientation. The silicon wafer may have any surface orientation, however, as is known in the art.

A crystal contains planes of atoms which influence the properties and behavior of a material. Thus, it is advantageous to identify various planes within crystals. In accordance with standard crystallographic nomenclature, such identification is done using Miller indices: three numbers within parentheses, namely (hkl). A plane that intersects the x, y, and z axes at 1, 1, and 0.5, respectively, is represented as (112). The Miller indices are the reciprocals of the three axial intercepts for a plane, cleared of fractions and common multipliers.

Further in accordance with standard crystallographic nomenclature, various symbols have specified meanings. Among those symbols are rounded brackets, { }, which refer to families of equivalent crystallographic planes (e.g., the {001} family of planes); parentheses, ( ), which refer to specific crystallographic planes (e.g., the (100) plane); horizontal triangles, ◊, which refer to families of equivalent crystallographic axes (e.g., the <011> family of axes); and square brackets, [ ], which refer to a specific crystal axis (e.g., the [110] axis). For example, in silicon crystals, the (100) plane and the (001) plane are equivalent to one another and, thus, are both in the same {001} family of planes.

The oxidation step used to form gate oxide 16 is strongly crystal orientation dependent. That is, the thickness of the oxide formed after a given time at a given temperature is dependent on the crystal orientation of the underlying silicon. Thus, the gate oxidation step tends to form gate oxide 16 with a thickness $d_1$ in the (110) planes that is greater than thickness $d_2$ in the (100) planes. The non-homogenous gate oxide thickness leads to weak points at the thinner sections where the time to breakdown is reduced relative to the rest of the gate oxide.

Similarly, the crystal dependency during oxidation steps also affects the creation of other oxides in DRAM trench structures, such as the "LOCOS collar," described below. Referring now to FIGS. 3–12, in which like reference numbers refer to like elements throughout, there is shown various aspects of an exemplary DRAM cell and intermediate steps in an exemplary process for making the cell. These process steps are disclosed by U.S. patent application Ser. No. 09/359,292 filed on behalf of Gary Bronner et al., assigned to the common assignee of this invention, and incorporated herein by reference.

As shown in FIG. 3, a typical deep trench storage capacitor of semiconductor memory device 10 is formed into a pad 22 and a substrate 24 by conventional processing techniques well known in the art. For example, an optical lithography step may be used to form a pattern on pad 22. Then a dry etching step, such reactive-ion etching (RIE), may be used to create a trench 20 to a desired depth through pad 22 and into substrate 24.

Deep trench 20 generally has a depth of about 3 μm to about 10 μm and a diameter or maximum width that is a function of the lithographic ground rule, typically about 0.5 μm to less than 0.1 μm. Trench 20 has sidewalls 32 and a bottom 33.

As shown in FIG. 4, an isolation collar 26 is formed in an upper region 28 of trench 20. Upper region 28 typically comprises 10–20% of the total depth of trench 20. Collar 26 may be formed using a local thermal oxidation (LOCOS) process, such as by the exemplary process explained below, or by other physical and chemical mechanisms, as also indicated below. Because of the traditional use of the LOCOS process, isolation collar 26 is sometimes referred to as a LOCOS collar.

Before the oxidation step, a barrier film (not shown) may be formed along the exposed surfaces of trench 20 and pad 22 such as by a low-pressure chemical vapor deposition (LPCVD) of a SiN film having a thickness of about 2 nm to about 10 nm. The barrier film is then removed from upper region 28, for example by filling trench 20 with photoresist (not shown) and partially etching the photoresist down into trench 20 to a depth controlled by the amount of overetch time. This step exposes the barrier film in upper region 28 while leaving the lower region 30 covered. The exposed barrier film may then be removed in upper region 28 of trench 20 and from pad layer 22, for example, by chemical or dry etching, and then the photoresist stripped away. Other processes for isolating sidewall 32 in upper region 28 while protecting sidewall 32 in lower region 30 may also be used.

The local oxidation step is then performed. The oxidation step may be conducted, for example, at oxidation conditions that promote the oxidation rate along one family of crystal axes over another. Such oxidation conditions induce faceting of the underlying silicon substrate 24 during growth of collar 26. Such a faceted collar may have a cross section similar to that shown for gate oxide 16 as illustrated in FIG. 2, where thickness di of the oxide aligned with one plane is greater than thickness $d_2$ of the oxide aligned with another crystal plane. Because of the different oxidation rates of the different crystal orientations, in order to achieve a minimum collar thickness on all of the sidewalls, regardless of crystal orientation, an unnecessary, increased thickness may be required on the sidewall having the faster-growing orientation. The thermal oxide collar 26 and associated faceting are formed only on sidewalls 32 in upper region 28 of trench 20; the barrier film protects sidewalls 32 in lower region 30 of trench 20.

Next, the barrier film in lower region 30 is typically stripped via a process that selectively leaves thermal oxide isolation collar 26 in upper region 28 of trench 20. A buried plate 34 is then created in lower region 30, leaving the configuration shown in FIG. 4. Buried plate 34 may be created by doping lower region 30 of trench 20 to form an out-diffusion in substrate 24 using collar 26 as a mask for upper region 28. The out-diffusion may be formed using arsenosilicate glass (ASG) drive-in, plasma doping (PLAD), plasma ion implantation (PIII), gas-phase diffusion of arsenic (As) or phosphorus (P), or other techniques known in the art.

Next, as shown in FIG. 5, a thin node dielectric 35 is created, such as by thermal nitridation, for example with ammonia ($NH_3$), followed by LPCVD of SiN. Finally, trench 20 is filled, such as with an n+ doped LPCVD polysilicon 36, and recessed to a desired depth $D_1$. Depth $D_1$ is typically about 300 nm to about 700 nm, preferably between 300 to 450 nm.

Isolation collar 26 is then etched away, such as with a wet etch using a solution containing hydrogen fluoride (HF), to expose sidewalls 32 in the area where the collar 26 is not covered by polysilicon 36 and below the polysilicon level to a depth $D_2$, as shown in FIG. 6. $D_2$ is typically about 10 nm to about 50 nm.

Next, as shown in FIG. 7, a buried strap 40 is formed. Typically of LPCVD silicon, buried strap 40 is formed in a layer having a thickness of about 10 nm to about 50 nm. As shown in FIG. 8, buried strap 40 is then removed from sidewalls 32 of trench 20 above polysilicon 36 and above pad 22, such as by an isotropic wet chemical or dry etching step.

Then, as shown in FIG. 9, trench-top dielectric 14 or trench-top oxide (TTO) is formed, such as by an anisotropic high-density plasma (HDP) or other bias-assisted oxide deposition step. The creation of trench-top dielectric 14 typically forms a corresponding layer (not shown) atop pad 22, which is removed by a chemical mechanical polishing (CMP) step as is known in the art. Thus exposed, pad 22 is then stripped, typically by a wet chemical etch step selective to trench-top dielectric 14, and a sacrificial oxide 44 is grown on the exposed surface of substrate 24 and exposed sidewall 32 of trench 20, as shown in FIG. 9.

Ion implantation may then be used to create a p-well 50 and an n-band 52 below p-well 50 in substrate 24. Similarly, ion implantation of As or P may be used to create diffusion region 18. Another diffusion region 62 is created by out-diffusion from n+ doped polysilicon region 36 through buried strap 40. Such process steps yield the structure shown in FIG. 9. Other device-threshold-tailoring implants may also be created at this time.

Next, as shown in FIG. 10, sacrificial oxide 44 is removed, such as by a chemical wet etch process with an HF-containing solution. Then, gate oxide 16 is grown and a conductive gate layer 48, such as polysilicon having a thickness approximately equal to the diameter of trench 20, is formed. A nitride pad (not shown) is formed having a thickness of approximately half to approximately equal to the thickness of gate layer 48.

An active area 54 is patterned (see FIG. 11), typically by photolithography, and an etching step, such as RIE, is performed to etch shallow trench isolation (STI) regions 46 everywhere except in active area 54. STI regions 46 are filled, typically with an oxide, and planarized by a CMP step down to the pad nitride. The pad nitride is then stripped away, leaving the structure shown in FIG. 10.

Next, a thin seed layer of polysilicon is typically deposited, extending polysilicon gate layer 48 over the edge of trench 20 and over top diffusion region 62 in p-well 50 of substrate 24. A middle layer 56, which typically comprises a higher conductivity material than polysilicon gate layer 48, such as tungsten (W) or tungsten silicide (WS), is then formed. Finally, a gate cap layer 58, comprising SiN or silicon oxide, is formed. The gate conductor layers are then patterned by lithography and dry etched, leaving the gate contact 220 (comprising gate layer 48, middle layer 56, and gate cap 58) shown in FIG. 12.

Next, sidewall isolation spacers 240, typically comprising silicon nitride, silicon oxide, or a combination of those materials, are created by processes well-known in the art to electrically isolate the wordline (gate contact 220) from the bitline (the source or diffusion contact 222). Spacers 240 are typically created by depositing a conformal coating of SiN of about 10 nm to about 100 nm, and performing an anisotropic dry spacer etch process to leave the spacers 240 only on the sidewalls of gate contact 220. At this time, optional added implants may be performed to tailor source and drain regions (diffusion regions 18 and 62) of the transistor.

Next, the isolating regions between multiple gate contacts 220 on the wafer are typically filled with an interlevel dielectric 63, and contact holes are etched via lithography and dry etching to create the holes in which to form source contact 222. Source contact 222 typically comprises doped polysilicon or a tungsten stud. The overlapping region 72 of source contact 222 and of gate cap layer 58 of gate contact 220, as shown in FIG. 12, is typical of diffusion contacts known as borderless contacts.

Thus, as shown in FIGS. 11 and 12, an exemplary trench-sidewall array device 60 results from the exemplary process described above. As shown, n+ diffusion regions 18, 62 under diffusion contact 64 adjacent to trench 20 serve as the source and drain of device 60. A channel 66 results in substrate 24 (p-well 50) adjacent faceted sidewalls 32 of trench 20. Although device 60 as shown in FIG. 11 has been fabricated across the (011) plane, device 60 may also be fabricated across the (001) plane. The surface of substrate 24 is typically along the (100) plane. Thus, device 60 may be along a crystallographic plane in the same family as the substrate surface {001}, or may be on a different crystallographic plane (011) in a different family, as shown in FIG. 11.

As stated above, the crystal dependency of standard oxidation processes used for forming, for example, the gate oxide and LOCOS collar in DRAM trenches manufactured by the traditional process described above, as well as in other processes known in the art, often results in a differential thickness in the oxide walls. The differential oxide wall thickness causes undesired effects. Among those effects are potential dislocations.

The present invention provides a process, and a semiconductor memory device manufactured by that process, for reducing the undesired effects of orientation-dependent oxidation and avoiding such potential dislocations. It should be noted that the conventional process described above resulting in the above structure is merely one exemplary process for creating a DRAM cell having a vertical transistor. Other processes known in the art can similarly benefit from the improvements of the present invention.

SUMMARY OF THE INVENTION

The present invention provides a process for forming an oxide layer on a sidewall of a trench in a substrate. The process comprises the steps of forming the trench in the substrate; forming a nitride interface layer over a portion of the trench sidewall; forming an amorphous layer over the nitride interface layer; and oxidizing the amorphous layer to form the oxide layer.

The oxidation step is preferably of sufficient duration to completely consume the amorphous layer over the nitride interface layer. The oxidation step may further be of sufficient duration, however, to oxidize a portion of the trench sidewall under the nitride interface layer. Typically, the amorphous layer is formed having a thickness that is approximately half of a desired oxide layer thickness. For example, the amorphous layer may have a thickness of about 25 to about 50 Angstroms when the oxide layer grows to a thickness of about 50 to about 100 Angstroms.

The process may be used, for example, to form a gate oxide for a vertical transistor, or an isolation collar. Where the process is used to form an isolation collar, the process further comprises forming a nitride-oxynitride barrier layer over the amorphous silicon layer, and then etching away a portion of the nitride-oxynitride barrier layer to define the portion of the amorphous silicon to be oxidized.

The invention also comprises a semiconductor memory device having a substrate and a trench in the substrate with a sidewall. An isolation collar comprising an isolation collar oxide layer is located on the trench sidewall in an upper portion of the trench. A vertical gate oxide comprising a gate oxide layer is located on the trench sidewall in the upper portion of the trench above the isolation collar. The isolation collar oxide layer may be disposed over an isolation collar nitride interface layer between the isolation collar oxide layer and the trench sidewall, the gate oxide layer may be disposed over a gate nitride interface layer between the gate oxide layer and the trench sidewall, or both.

It is to be understood that both the foregoing general description and the following detailed description are exemplary, but are not restrictive, of the invention

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 3 through 10 are in-process longitudinal section illustrations depicting an exemplary process for manufacturing an exemplary DRAM as is known in the art and, more specifically, FIG. 3 shows a typical trench and pad layer;

FIG. 4 shows an isolation collar formed in the upper region of the trench and a buried plate in the lower region of the trench;

FIG. 5 shows the trench of FIG. 4 after a dielectric is applied and the trench is partly filled with polysilicon;

FIG. 6 shows the trench of FIG. 5 after the collar is etched;

FIG. 7 shows the trench of FIG. 6 after a buried strap is formed;

FIG. 8 shows the trench of FIG. 7 after the buried strap is removed from the sidewalls of the trench above the polysilicon and above the pad;

FIG. 9 shows the trench of FIG. 8 after a trench-top dielectric is formed, the pad is stripped, a sacrificial oxide is grown on the exposed surface of the substrate and on the exposed sidewall of the trench, a p-well and an n-band are created in the substrate, and diffusion regions are formed in the substrate;

FIG. 10 shows the trench of FIG. 9 after the sacrificial oxide is removed, a gate oxide is grown, a conductive gate layer is formed, an active area is patterned, an etching step is performed to etch shallow trench isolation (STI) regions everywhere except in the active area, the STI regions are filled and planarized to the pad nitride, and the pad nitride is stripped away;

FIG. 13 is an in-process longitudinal section illustration of a trench having an isolation collar manufactured by an exemplary process of the present invention, showing the amorphous silicon layer before oxidation;

FIG. 14 is an in-process longitudinal section illustration of the trench of FIG. 13 just before an oxidation step to form a gate oxide layer by an exemplary process of the present invention;

FIG. 15 is an in-process longitudinal section illustration of the trench of FIG. 14 after formation of the gate oxide layer; and FIG. 16 is a cross section of a portion of the gate oxide of the structure of FIG. 15 taken along the line 16—16.

DETAILED DESCRIPTION OF INVENTION

Figure 1:
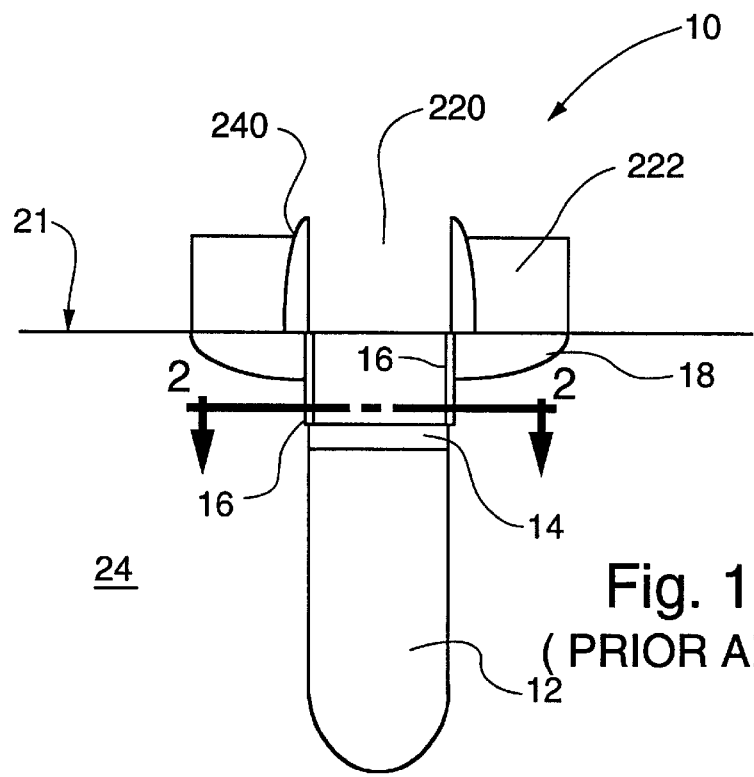
FIG. 1 is a longitudinal section of a schematic illustration of a typical DRAM device having a vertical transistor structure of the prior art.

Referring now to FIGS. 13 and 14, an exemplary process of the present invention will be explained. FIG. 13 shows trench 200 on which isolation collar 130 is formed. The LOCOS process described in the background section of this application may be performed to carry out the oxidation, or other oxidation steps known in the art may be used.

Before the oxidation step, a nitride interface barrier film 125 is formed along the exposed surfaces of trench 200 and pad 22, such as by a low-pressure chemical vapor deposition (LPCVD) step comprising exposing the surfaces to an atmosphere of $NH_3$ at 400–900° C., more preferably 500–700° C. Barrier film 125 is typically in a range of about 0.5 to 2 nm, and preferably about 1 nm thick. Overtop of barrier film 125 is formed amorphous silicon (a-Si) layer 127. The a-Si layer 127 may have a thickness in a range of about 5 nm to about 20 nm, with a preferred thickness of about 10 nm. Next, a barrier film 129, such as a nitride-oxynitride film, is formed over a-Si layer 127, such as by LPCVD of a SiN film having a thickness of about 2 nm to about 10 nm, preferably about 5.5 nm. As defined in this document, the term "nitride-oxynitride" means that the film may be formed of silicon nitride, silicon oxynitride, or a combination of those materials.

Barrier film 129 may then be removed from upper region 28, for example by filling trench 200 with photoresist (not shown) and partially etching the photoresist down into trench 200 to a depth controlled by the amount of overetch time. This step exposes a portion of barrier film 129 in upper region 28 while leaving the portion in lower region 30 covered. The portion of barrier film 129 in upper region 28 of trench 20 and on pad layer 22 is then removed, for example, by a chemical or dry etching (CDE) recess step, and then the photoresist stripped away. Other processes for isolating sidewall 32 in upper region 28 while protecting sidewall 32 in lower region 30 may also be used.

The local oxidation step is then performed, during which amorphous silicon layer 127 oxidizes into a silicon oxide layer to form oxide isolation collar 130 as is shown in FIG. 14. Typical oxidation conditions are 800–900° C. in an oxygen atmosphere. After oxide layer 130 is formed, the barrier film 129, and optionally a-Si layer 127 and nitride interface layer 125, in lower region 30 is typically stripped via a process that selectively leaves oxide isolation collar 130 in upper region 28 of trench 20. Although if desirable for the process flow, a-Si layer 127 and interface film 125 in lower region 30 may remain temporarily if not removed in this step, both must be removed eventually.

The remaining steps are conducted as are well known in the art, such as described in the background section above, to reduce the length of collar 130 and to create the remaining elements shown in FIG. 14. After removing sacrificial oxide 44 (see FIG. 9) from the trench sidewall, such as with an oxide wet etch step, gate oxide 160 is then grown in accordance with the present invention. First, a nitride interface layer 1250 is formed as described above for the formation of interface layer 125 under the isolation collar 130. Next, as shown in FIG. 14, amorphous layer 1270 is formed having a thickness of between about 1 to about 10 nm, preferably about 2.5 to about 5 nm, and more preferably about 3 nm. Next, the gate oxide is grown from amorphous layer 1270 to form gate oxide layer 160 as is shown in FIG. 15.

The remaining structure is formed as is known in the art, for example as described in the background section above. Processing in accordance with the present invention leaves a nitride layer and an oxide layer over TTO 14 and over the top surface 21 of substrate 24. Typically, the extra nitride and oxide layers over TTO 14 are beneficial as additional insulation, but can be removed if desired. Similarly, the nitride and oxide layers over surface 21 can remain or be removed, depending upon the additional processing desired.

Both the isolation collar growth process and the vertical gate oxide growth process, described above, offer advantages over the prior art in that the oxide layer is formed from the amorphous layer that is deposited over the nitride interface layer. As a result, the oxide growth is independent of the crystallographic orientation of the trench sidewalls. Because the growth is independent of the crystallographic orientation of the sidewalls, the thickness of the oxide layer is uniform along the entire cross section of the trench, as is shown in FIG. 16.

Figure 2:
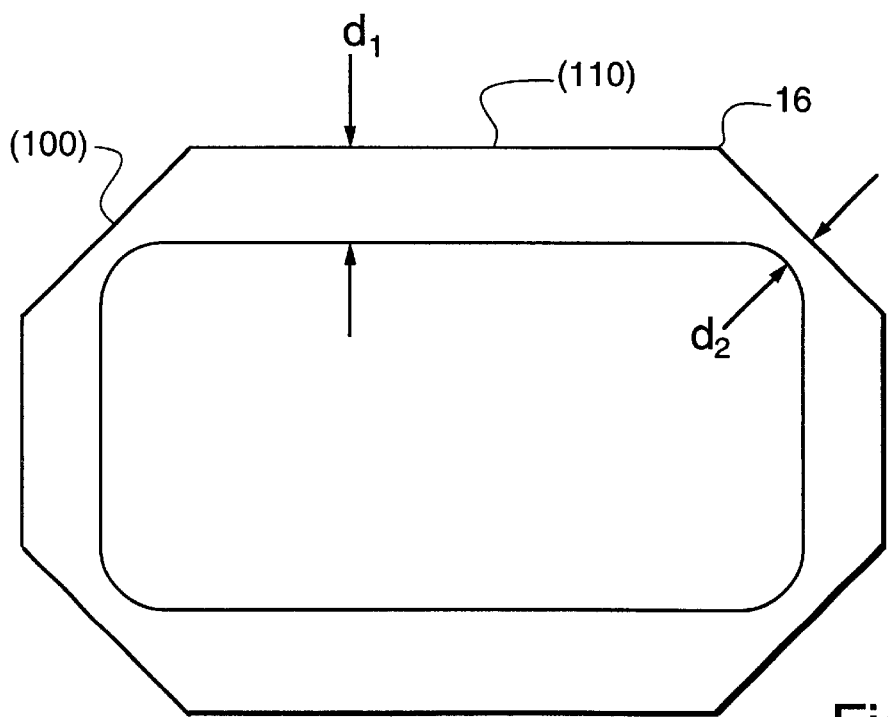
FIG. 2 is a cross section of a portion of the gate oxide of the structure of FIG. 1 taken along line 2—2.
Figure 3:
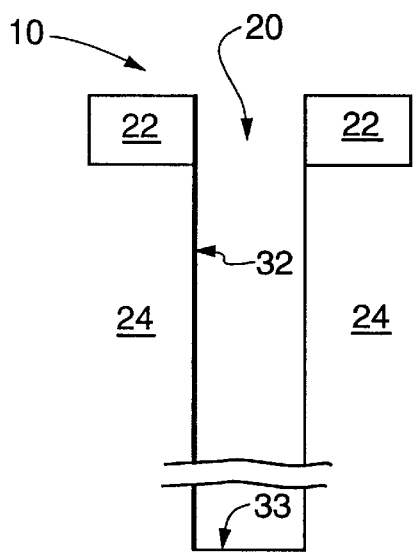
Figure 4:
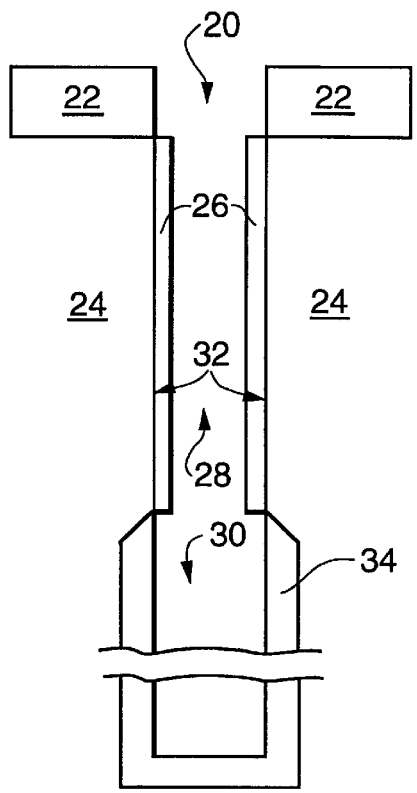
Figure 12:
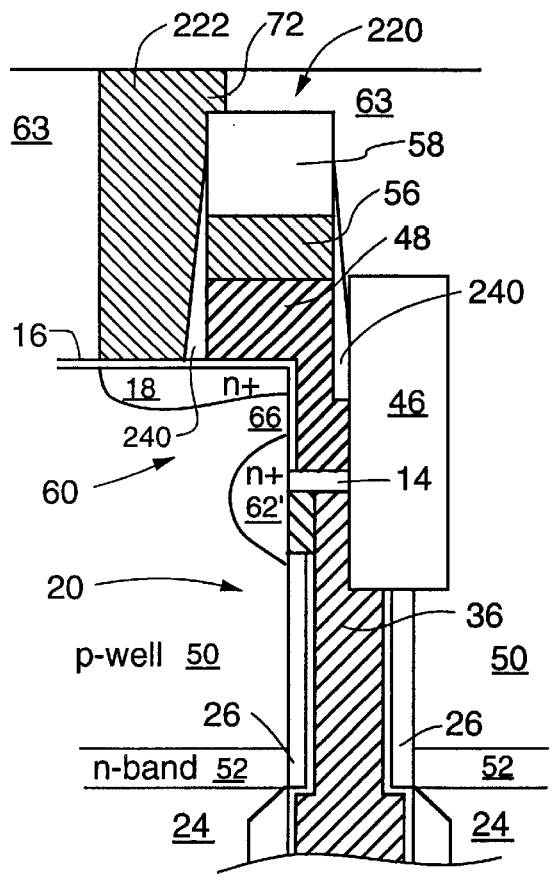
FIG. 12 is a longitudinal section illustration of the DRAM cell of FIG. 11 taken along the line 12—12.
Figure 11:
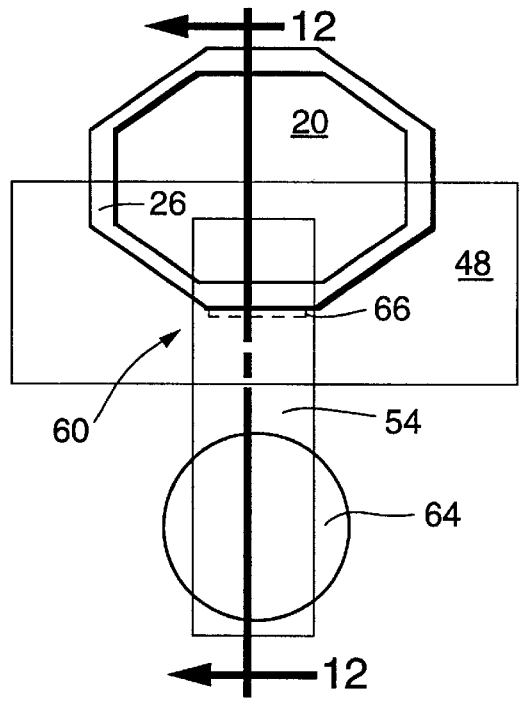
FIG. 11 is a plan view illustration of an exemplary DRAM cell as is known in the art.

Note that, because there is no differential growth of the oxide along crystalline planes, the oxide growth step does not facet the sidewalls, as in some of the known processes in the prior art. Other steps may cause faceting, however, such as wet-etch steps that may be selective to certain crystalline planes. The shape of the trench is also dependent on the initial mask pattern used to lay out the trench shape in the first place. In any event, the trench shape may be faceted similar to that shown in FIG. 2 (except with an oxide of equal thickness all around in accordance with the present invention) or may have a "stretched-circle" or elliptical cross-section as shown in FIG. 16. Significantly, however, the oxide growth step according to the present invention does not modify the trench shape from its shape before the oxidation step.

During the oxidation steps, nitride interface layers 125 and 1250 act as oxidation barriers, so that the amorphous silicon is completely oxidized before the oxidation progresses further into the crystalline silicon sidewalls 32. The oxidation step can be tailored to either stop on the nitride interface layer or to further oxidize a defined amount of the crystalline silicon adjacent trench sidewalls 32 to form an inner oxide layer 162 under the nitride interface layer, as is shown in FIG. 16. As is well-known in the art, the degree of oxidation can be controlled by controlling the thermal budget (time and temperature) of the oxidation step.

Typically, the amorphous silicon more than doubles in size during the oxidation step. Thus, the step of forming the amorphous silicon layer generally comprises depositing an amorphous silicon layer that is approximately less than half the thickness of the desired oxide thickness. Although both isolation collar 130 and vertical gate oxide 160 of a single DRAM structure are formed by the process of the present invention in the example, one component may be formed by the process of this invention and the other formed by the standard processes known in the art.

Thus, an exemplary semiconductor memory device 10 of the present invention comprises a substrate 24 and a trench 200 in the substrate having a sidewall 32, as shown in FIGS. 15 and 16. A buried plate capacitor 34 is located in a lower region 30 of the trench. An isolation collar 130 is located on the trench sidewall 32 in an upper region 28 of the trench. The device 10 further comprises a buried strap 40 on trench sidewall 32 in the upper region of the trench above isolation collar 130, and a trench top oxide 14 over the buried strap in the upper region of the trench. A vertical gate oxide 160 is located on the trench sidewall in the upper region of the trench above the trench top oxide. Vertical gate oxide 160 is disposed over nitride interface layer 1250 and isolation collar 130 is disposed over nitride interface layer 125 between the oxide and the trench sidewall. As stated with respect to the process of this invention, instead of both gate oxide 160 and isolation collar 130 being disposed over nitride interface layers 1250 and 125, respectively, only one component may be so disposed, with the other having the standard disposition known in the art.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A deep trench isolation collar oxide layer produced by a process comprising the steps of:
   (a) forming a trench having a sidewall in a substrate;
   (b) forming a nitride interface layer over at least a portion of the trench sidewall;
   (c) forming an amorphous silicon layer over the nitride interface layer;
   (d) forming a nitride-oxynitride barrier layer over the amorphous silicon layer;
   (e) etching away a portion of the nitride-oxynitride barrier layer to uncover a portion of the amorphous silicon layer desired to be oxidized for formation of the isolation collar;
   (f) oxidizing the amorphous silicon layer to form the isolation collar oxide layer; and
   (g) forming a node dielectric layer over the isolation collar oxide layer.

2. The deep trench isolation collar oxide layer of claim 1, wherein the oxide layer cross section has a periphery with a substantially uniform thickness.

3. The deep trench isolation collar oxide layer of claim 1, wherein the trench sidewalls are not faceted.

4. A semiconductor device comprising:

a substrate having a trench with a sidewall;

an isolation collar including an isolation collar oxide layer on the trench sidewall in an upper region of the trench;

a vertical gate oxide including a gate oxide layer on the trench sidewall in an upper region of the trench above the isolation collar;

at least one of (a) an isolation collar nitride interface layer disposed on the trench sidewall, with the isolation collar disposed over the isolation collar nitride interface layer, and (b) a gate nitride interface layer disposed on the trench sidewall, with the vertical gate oxide disposed over the gate nitride interface layer; and wherein the trench sidewall, underlying at least one of said isolation collar nitride interface layer and said gate nitride interface layer further includes an oxide layer.

5. The semiconductor memory device of claim 4 wherein the semiconductor memory device comprises a DRAM device.

6. The semiconductor memory device of claim 4 wherein the isolation collar oxide layer and the gate oxide layer both comprise a silicon oxide and the substrate comprises a crystalline silicon wafer.

7. The semiconductor memory device of claim 4 wherein the isolation collar oxide layer disposed over the isolation collar nitride barrier layer has a thickness in a range of about 5 to about 20 nanometers, the gate oxide layer disposed over the gate nitride barrier layer has a thickness in a range of about 5 to about 10 nanometers, or both.

8. The semiconductor memory device of claim 7 wherein the gate oxide layer has a thickness of about 6 nanometers and is disposed over the gate nitride barrier layer.

9. The semiconductor memory device of claim 4 wherein the isolation collar oxide layer has a thickness of about 10 nanometers and is disposed over the isolation collar nitride barrier layer.

10. The semiconductor memory device of claim 4 wherein at least one of the isolation collar nitride interface layer and the gate nitride interface layer has thickness in a range of about 0.5 to about 2 nanometers.

11. The semiconductor memory device of claim 4 wherein at least one of the isolation collar nitride interface layer and the gate nitride interface layer has thickness of about 1 nanometer.

12. The semiconductor memory device of claim 4, wherein at least one of the vertical gate oxide layer or the isolation collar oxide layer has a periphery with a substantially uniform thickness.

13. The semiconductor memory device of claim 4, wherein the trench sidewalls are not faceted.

* * * * *